United States Patent [19]
Jacobsen

[11] Patent Number: 5,273,622
[45] Date of Patent: Dec. 28, 1993

[54] SYSTEM FOR CONTINUOUS FABRICATION OF MICRO-STRUCTURES AND THIN FILM SEMICONDUCTOR DEVICES ON ELONGATE SUBSTRATES

[75] Inventor: Stephen C. Jacobsen, Salt Lake City, Utah

[73] Assignee: Sarcos Group, Salt Lake City, Utah

[21] Appl. No.: 898,935

[22] Filed: Jun. 15, 1992

Related U.S. Application Data

[63] Continuation-in-part of Ser. No. 816,628, Dec. 31, 1991.

[51] Int. Cl.⁵ .................... H01L 21/306; B44C 1/11; C03C 15/00; C23F 1/00
[52] U.S. Cl. .................. 156/659.1; 156/633; 156/645; 156/657; 156/662; 156/345; 437/228; 437/229; 437/238
[58] Field of Search ........... 156/633, 645, 657, 659.1, 156/662, 345; 437/228, 229, 233, 238, 245, 249, DIG. 928

[56] References Cited

U.S. PATENT DOCUMENTS 3,534,467 10/1970 Sachs et al. .................. 437/249
5,106,455 4/1992 Jacobsen et al. .............. 156/659.1

Primary Examiner—William A. Powell
Attorney, Agent, or Firm—Thorpe, North & Western

[57] ABSTRACT

A method of fabricating semiconductor devices on a moveable fiber includes the steps of moving the fiber longitudinally along a predetermined pathway, applying a semiconductor material to at least a portion of the surface of the fiber at a first station along the pathway, applying a resist over the semiconductor material at a second station spaced from the first station in a direction of movement of the fiber, pre-baking the resist at a third station spaced from the second station, exposing a predetermined semiconductor device pattern in the resist at a fourth station spaced from the third station, developing the exposed resist at a fifth station along the pathway, etching or depositing the predetermined pattern on the material over which the exposed resist was located at a sixth station along the pathway, and removing the remaining resist from the semiconductor material at a seventh station along the pathway. Additionally, an eighth station could be provided for cutting the fiber into selected lengths for later assembly into bundles or combinations for the construction of electrical apparatus.

33 Claims, 1 Drawing Sheet

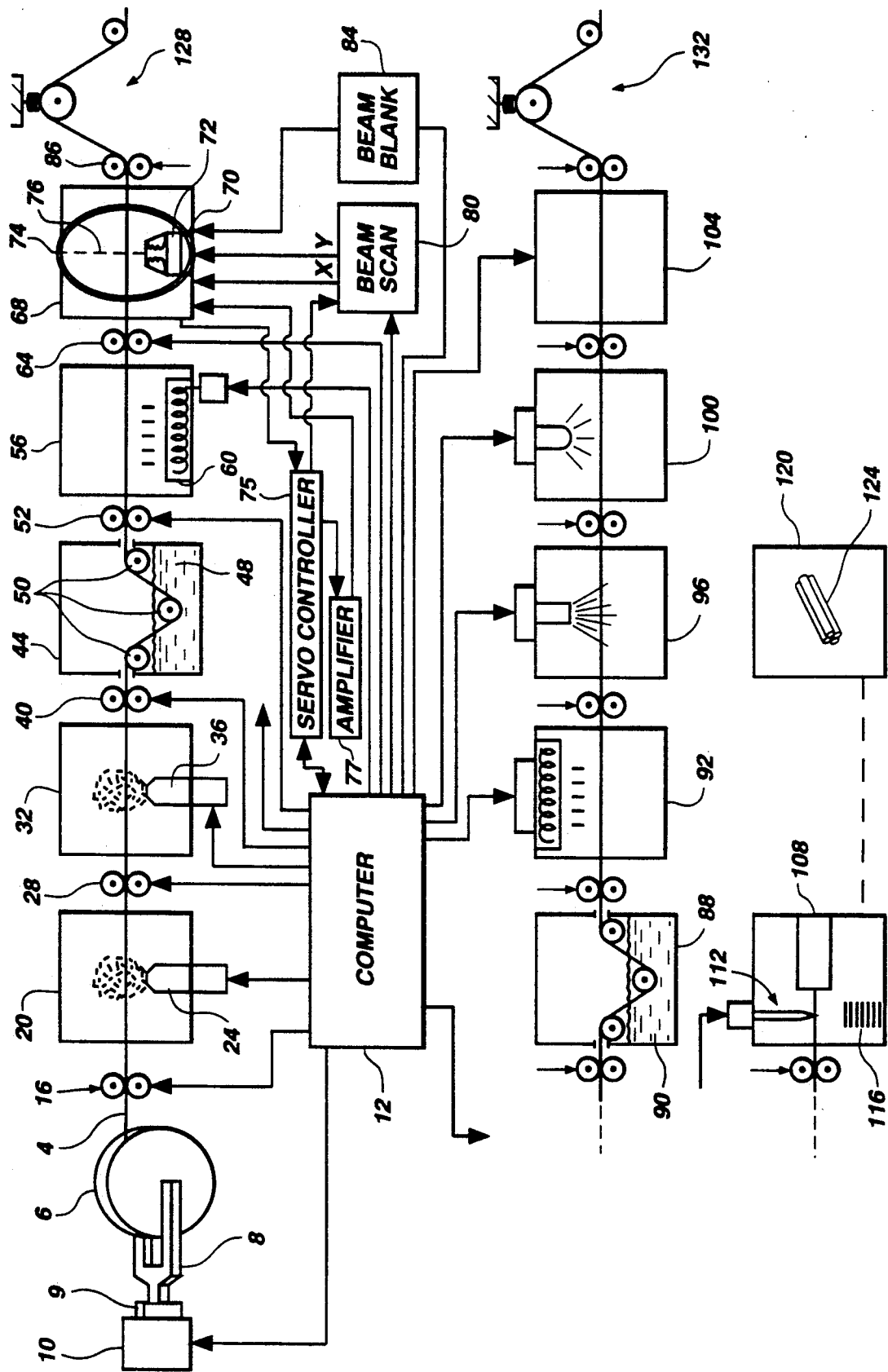

SYSTEM FOR CONTINUOUS FABRICATION OF MICRO-STRUCTURES AND THIN FILM SEMICONDUCTOR DEVICES ON ELONGATE SUBSTRATES

BACKGROUND OF THE INVENTION

This is a continuation-in-part application of application Ser. No. 07/816,628, filed Dec. 31, 1991.

The present invention relates to a system for fabricating micro-structures and thin-film semiconductor devices in a continuous fashion on an elongate base or substrate element, such as a strand or fiber.

Lithographic techniques have been utilized for some time in the manufacture especially of integrated circuit boards and semiconductor devices and related products. The products manufactured, of course, have typically included planar surface areas to which the lithographic techniques were applied. Such techniques have proven extremely effective in the precise manufacturing and formation of very small details in the product. However, attempts to apply such techniques to other than planar surfaces have proven difficult, if not unachievable, until very recently. In patent application, Ser. No. 07/647,659, filed Jan. 28, 1991, now U.S. Pat. No. 5,106,455, there is disclosed a method and apparatus for fabricating very small devices or micro-structures using non-planar, exposure beam lithography. Using this method and apparatus, very fine, precise and detailed physical structures can be formed on very small three-dimensional objects such as, for example, cylinders.

In application Ser. No. 07/816,628, filed Dec. 31, 1991, of which this is a continuation-in-part application, there is disclosed a method and apparatus for fabricating thin-film semiconductor devices using non-planar, exposure beam lithography. In particular, a variety of semiconductor devices can be formed on three-dimensional substrates, again such as cylinders.

The method and apparatus disclosed in the above two patent applications provide for fabrication of individual micro-structures or thin film semiconductor devices in a type of batch processing approach. In this application, a continuous processing approach is disclosed for fabricating micro-structures and thin-film semiconductor devices.

SUMMARY OF THE INVENTION

It is an object of the invention to provide a system for fabricating micro-structures and thin-film semiconductor devices utilizing lithographic techniques in a continuous processing array.

It is also an object of the invention to provide such a system which allows for the fabrication of fine details over elongate work pieces in a rapid and efficient manner.

It is a further object of the invention to provide such a system in which precise control of the fabrication process may be effected.

It is still another object of the invention to provide such a system in which an elongate work piece or substrate may be processed as it moves along a fabrication line.

The above and other objects of the invention are realized in a specific illustrative system for fabricating microstructures on a moveable elongate rod. The system includes the steps of moving the elongate rod longitudinally along a certain pathway, applying a resist to the rod at a first location along the pathway, setting the resist at a second location along the pathway forwardly of the first location, exposing a predetermined pattern in the resist at a third location along the pathway forwardly of the second location, developing the exposed resist at a fourth location along the pathway forwardly of the third location, and etching/depositing material on the rod in a manner determined by the pattern, at a fifth location along the pathway forwardly of the fourth location.

In accordance with one aspect of the invention, the exposing step includes the steps of moving the rod longitudinally and rotating the rod about its longitudinal axis, and selectively directing an exposure beam, such as an electron beam, ion beam, laser beam or x-ray beam, toward the rod as it moves and rotates, to thereby expose the predetermined pattern in the resist. In accordance with another aspect of the invention, the system further includes the step of cutting the rod into selected lengths at a sixth location along the pathway forwardly of the fifth location, for later assembly of the lengths into bundles or other composite structures.

BRIEF DESCRIPTION OF THE DRAWING

The above and other objects, features and advantages of the invention will become apparent from a consideration of the following detailed description presented in connection with the accompanying drawing which shows, schematically, a system for fabricating microstructures and thin-film semiconductor devices on elongate substrates in a continuous fashion, in accordance with the principles of the present invention.

DETAILED DESCRIPTION

Referring to the drawing, there is shown one illustrative embodiment of a system for continuously fabricating microstructures or semiconductor devices on a laterally flexible strand or filament 4 wound on a dispensing spool 6 which is rotatably mounted on a fork support 8. The fork support 8, in turn, is mounted in a chuck 9 which may be selectively rotated by a rotary stage 10 under control of a computer 12. Advantageously, the filament 4 is made of quartz, silica, sapphire, or other suitable semiconductor substrate material.

The filament 4 is threaded through a pair of rollers 16 positioned adjacent the spool 6, and powered by conventional motors (not shown), to rotate under control of the computer 12 to draw the filament from the spool and move it toward other stations laid out in a pathway over which the filament will travel. The computer 12, which controls the overall operation of the system shown in the drawing, could illustratively be a Sun 4 computer or the Sun IPX.

In the next stage or station of the process, the filament 4 is passed through a chamber 20 where a semiconductor material, such as p-type doped silicon is sputtered or chemically deposited onto the filament from a semiconductor material source 24. Such sputtering or chemical vapor deposition is conventional and would be carried out under control of the computer 12. The result of this stage of the process is that a layer of semiconductor material, for example, of from 2,000 to 7,000 Angstroms, is deposited uniformly about the filament 4. A pair of rollers 28, operating under control of the computer 12, draw the filament through the chamber 20 to supply it to the next station in the system.

In the next station, illustrated as another chamber 32, an insulator material is applied over the semiconductor layer, again by sputtering, chemical vapor deposition or evaporation from a source 36, under control of the computer 12. The thickness of the insulation layer might illustratively be from 500 to 3,000 Angstroms and would essentially surround the filament, overlying at least a portion of the semiconductor material. The insulator material might illustratively be silicon nitride, silicon dioxide, or some combination of the two.

At this stage or a separate stage, it might also be desirable to coat the filament with an adhesion promoter such as HMDS which improves the ability of beam resist to adhere to the surface. Such beam resist is applied in chamber 44 by dip coating the filament 4 into a bath 48 of beam resist. The filament is directed into and out of the bath 48 by rollers 50. Pairs of rollers 40 and 52, operated under control of computer 12, keep the filament 4 moving along the predetermined pathway through chamber 44 to the next station in the process. At this station, in a chamber 56, the beam resist solvents ar baked out and the resist set by heating from a heat source 60. The heat source 60 is operated under control of the computer 12. Alternative ways of applying resist include sputter coating, ultrasonic spray coating and vapor coating.

After setting the resist, the filament 4 is moved by rollers 64 to for example, an electron beam vacuum chamber station 68. In the chamber 68 is disposed a conventional electron beam generator 72 of an electron beam lithography system, but mounted on a track 74 to rotate circumferentially about the filament 4. The electron beam generator 72 produces an electron beam 76 which is directed towards the filament 4 as it moves through the chamber 68. The direction of the electron beam 76 is under control of a beam scan control unit 80 and may be changed or caused to move along two orthogonal axes (designated the x and y axes) laterally of the beam. The beam scan control unit 80 applies analog signals to coils in the electron beam generator 72 to control the direction of the electron beam 76, all in a conventional manner. The beam scan control unit 80 might illustratively be a digital-to-analog converter which receives digital signals from the computer 12 identifying the x and y coordinates which the electron beam 76 is to have. A conventional beam blanking circuit 84 is provided to operate under control of the computer 12 to vary the intensity of the electron beam 76. This intensity can be varied from 0 (no beam) up to some predetermined upper limit intensity. Such operation is well known.

As the filament 4 is moved through the chamber 68, the electron beam generator 72 is selectively moved on the track 74, under control of the computer 12, to expose a pattern in the resist on the filament which extends longitudinally along and circumferentially about the filament. In effect, movement of the filament 4 longitudinally allows for the longitudinal extension of the pattern on the filament, and movement of the electron beam generator 72 circumferentially on the track 74 allows for extension of the pattern circumferentially about the filament, all under control of the computer 12.

The electron beam generator 72 is mounted on a motorized carriage 70 to move on the track 74 under control of a servocontroller 75 and computer 12. The computer 12 supplies signals to the controller 75 in the form of commands for movement of the motorized carriage 70 on the track 74. These signals are supplied to the amplifier 77 which then supplies command signals to the motorized carriage 70 to cause the desired operation and movement of the carriage. As the motorized carriage 70 is operated, it develops feedback signals representing the respective degrees of movement of the carriage and these signals are supplied to the controller 75 which, in turn, supplies the signals to the computer 12. The computer 12 compares the feedback signals with the previously issued command signals to determine if the movement of the motorized carriage 70 was in accordance with the command signals, and to make appropriate corrections if needed. The servocontroller 75 might illustratively be Galil DMC-620 controller and the amplifier 77 might illustratively be a Galil ICB-960 amplifier. The motorized carriage 70 could be a circular version of a translational stage, number MF04, manufactured by Klinger.

After exposure of the desired pattern, the exposed resist is developed in chamber 88, for example, by dipping the filament 4 in a chemical developer 90, and the resist overlying the exposed pattern is washed away (positive lithography) or the resist overlying areas other than the exposed pattern is washed away (negative lithography). This, of course, is all conventional. The next step in the process, illustrated at chamber 92, is to bake the filament 4, for example, for about 30 minutes at 80 degrees centigrade. The filament 4 is now ready for etching which is carried out by exposing the filament to an appropriate etching reagent in chamber 96. In positive lithography, the pattern would be etched directly, for example, by using buffered hydrofluoric acid to remove insulator (silicon dioxide) from the regions down to the semiconductor layer, whereas in negative lithography, the areas other than the pattern would be etched to remove insulator from those areas. After etching, the remaining electron beam resist is removed stripped at the next station, chamber 100, in a conventional fashion.

In the next stage of the embodiment of the system shown in the drawing, a doping station furnace 104 is shown for example to provide doping for certain regions on the filament 4 where the semiconductor material has been exposed to produce, for example, transistors of various kinds. Alternatively, a doping bath could be provided at station 104.

Other stations could be provided in the production line to provide for further processing similar to that already described such as, for example, the application of an electrical conductor pattern onto the insulator material and in contact with the doped regions. This would be carried out again by applying a layer of conductive material over the filament 4 by sputtering, chemical vapor deposition, or evaporation, applying an electron beam resist over the layer of conductive material and setting the resist, exposing all areas of the resist except that overlying the desired conductor pattern, developing and washing away the exposed resist leaving resist overlying the desired conductor pattern, and then etching away that part of the conductive layer not covered by resist to leave the desired conductor pattern which would be exposed after the remaining resist is removed.

The final stage of the system of the drawing is a cutting station 108 at which a cutter 112, such as a diamond dicing saw, operates under the control of the computer 12 to cut the filament 4 into desired lengths 116 where, for example, each length would include the desired semiconductor device or devices. The lengths 116 could then be assembled into some desired electrical component such a shown at 124 comprising a bundle of the filament lengths, in contact with one another to exchange electrical signals such as described in copending patent application Ser. No. 07/871,336, filed Apr. 21, 1992.

Because it may be necessary to move the filament 4 at different speeds at different stations, or to stop the filament at one station while allowing it to continue moving at another station, take-up reels 128 and 132 are shown after stations 68 and 104. Of course, such take-up reels could be disposed between any stations where different speeds of the filament were required. Roller pairs 16, 28, 40, etc., operating under control of the computer 12, determine the speed of the filament through the different processing stages.

Although the fabrication of semiconductor devices on a filament has been described for the system shown in the drawing, it is apparent that various microstructures, either with or without electronic circuitry could be fabricated using at least some of the stages or stations of the system. Also, although electron beam exposure of the resist was described for the system of the drawing, it should be understood that apparatus could be provided for directing a laser beam, ion beam, x-ray beam or ultraviolet light, toward the filament as it passed through station 68.

Additionally, movement of the electron beam generator 72 about the filament was described for allowing the exposure beam to contact the filament circumferentially about its exterior surface (or layers of material deposited thereon), while movement longitudinally of the filament allowed for the longitudinal extent of patterns being formed, it should be understood that a plurality of exposure beam devices could be positioned circumferentially about the filament, and then selected ones of the devices activated to provide the desired circumferential extent of the pattern being formed. Also, cylindrical masks could be utilized at exposure stations, with the filament 4 being threaded to move through the masks, and periodically being stopped to allow for exposure.

Further, mirrors positioned circumferentially about the filament to redirect a beam from a beam generator to the filament could be utilized, as could rotating the fiber under the beam by selectively rotating roller pairs 64 and 86 to thereby cause rotation of the filament.

At various stage of the process, sputtering, chemical deposition, and evaporation were discussed as methods of depositing material on the filament as it moved through the deposition stages, but it should be understood that spraying and dipping (which was shown for several stages) could be utilized at the deposition stages.

It is to be understood that the above-described arrangements are only illustrative of the application of the principles of the present invention. Numerous modifications and alternative arrangements ma be devised by those skilled in the art without departing from the spirit and scope of the present invention and the appended claims are intended to cover such modifications and arrangements.

What is claimed is:

1. A method of fabricating semiconductor devices on a moving elongate substrate comprising the steps of:
   (a) moving the elongate substrate longitudinally along a predetermined pathway,
   (b) applying a semiconductor material to at least a portion of the surface of the substrate at a first station along the pathway,
   (c) applying a resist over the semiconductor material at a second station along the pathway in the direction of movement of the substrate from the first station,
   (d) setting the resist at a third station along the pathway in the direction of movement of the substrate from the second station,
   (e) exposing a predetermined semiconductor device pattern in the resist at a fourth station along the pathway in the direction of movement of the substrate from the third station,
   (f) developing the exposed resist at a fifth station along the pathway in the direction of movement of the substrate from the fourth station,
   (g) etching/depositing the predetermined pattern on the material over which the exposed resist was located at a sixth station along the pathway in the direction of movement of the substrate from the fifth station, and
   (h) removing the remaining resist from the semiconductor material at a seventh station along the pathway in the direction of movement of the substrate from the sixth station.

2. A method as in claim 1 further including the step of
   (i) applying conductive material at preselected location over the semiconductor material at an eighth station along the pathway in the direction of movement of the substrate from the seventh station.

3. A method as in claim 2 further including the step of
   (j) cutting the substrate into selected lengths at a ninth station along the pathway in the direction of movement of the substrate from the eighth station.

4. A method as in claim 3 further including the step of
   (k) assembling selected cut lengths of the substrate into a combination at a tenth station along the pathway in the direction of movement of the substrate from the ninth station.

5. A method as in claim 1 wherein said moving step further comprises selectively rotating the substrate about its longitudinal axis as it moves to allow the forming of semiconductor devices about the lateral periphery of the substrate and longitudinally.

6. A method as in claim 1 wherein step (e) comprises selectively moving an exposure beam source circumferentially about the substrate and directing the exposure beam toward the substrate as it moves and rotates to thereby expose the predetermined semiconductor pattern in the resist.

7. A method as in claim 6 wherein the exposure beam is an electron beam.

8. A method as in claim 6 wherein the exposure beam is an ion beam.

9. A method as in claim 6 wherein the exposure beam is a laser beam.

10. A method as in claim 6 wherein the exposure beam is an x-ray beam.

11. A method as in claim 6 wherein the exposure beam is ultraviolet light.

12. A method as in claim wherein the substrate comprises a laterally flexible fiber.

13. A method as in claim 12 wherein the fiber has a generally circular cross-section.

14. A method as in claim 13 wherein the fiber is made of an electrically insulative material.

15. A method as in claim 14 wherein the fiber is made of a material selected from the group consisting of quartz, silica, sapphire, ceramic, piezoceramic, and semiconductors.

16. A method as in claim 1 wherein step (b) comprises sputtering the material to coat the substrate.

17. A method as in claim 1 wherein step (b) comprises chemical vapor deposition of the material onto the substrate.

18. A method as in claim 1 wherein step (b) comprises evaporation of the material onto the substrate.

19. A method as in claim 1 further comprising periodically repeating steps (b) through (h) on said substrate.

20. A method of etching/depositing a pattern on a moveable elongate rod comprising the steps of
    (a) moving the elongate rod longitudinally along a certain pathway,
    (b) applying a resist to the rod at a first location along the pathway,
    (c) setting the resist at a second location along the pathway forwardly of the first location,
    (d) directing exposure beams toward the rod at a third location along the pathway forwardly of the second location to expose a pattern in the resist circumferentially and longitudinally on the rod,
    (e) developing the exposed resist on the rod at a fourth location along the pathway forwardly of the third location, and
    (f) etching/depositing material on the rod in a manner determined by said pattern, at a fifth location along the pathway forwardly of the fourth location.

21. A method as in claim 20 wherein step (d) comprises moving the rod longitudinally and rotating the rod about its longitudinal axis.

22. A method as in claim 20 wherein the exposure beam is an electron beam.

23. A method as in claim 20 wherein the exposure beam is an ion beam.

24. A method as in claim 20 wherein the exposure beam is a laser beam.

25. A method as in claim 20 wherein the exposure beam is an x-ray beam.

26. A method as in claim 20 wherein the exposure beam is ultraviolet light.

27. A method as in claim 20 wherein the rod comprises a laterally flexible strand.

28. A method as in claim 27 further comprising the step of
    (g) cutting the strand into predetermined lengths at a sixth location forwardly of the fifth location.

29. A method as in claim 27 wherein step (f) comprises applying an etching reagent to the strand.

30. A method as in claim 27 wherein step (f) comprises depositing a material on the strand.

31. A method as in claim 27 wherein said strand is material selected from the group consisting of aluminum, gold, silica nitride, steel and quartz.

32. A method as in claim 20 wherein step (d) comprises moving the rod longitudinally and moving the exposure beam relative to the circumference of the rod.

33. A method as in claim 20 wherein step (d) comprises moving the rod longitudinally and rotating the rod about its longitudinal axis and moving the exposure beam relative to the circumference of the rod.

* * * * *